(12) United States Patent
Moon et al.

(10) Patent No.: US 6,821,572 B2
(45) Date of Patent: Nov. 23, 2004

(54) METHOD OF CLEANING A CHEMICAL VAPOR DEPOSITION CHAMBER

(75) Inventors: Kwang-Jin Moon, Yongin-si (KR);
Gil-Heyun Choi, Yongin-si (KR);
Sang-Bum Kang, Seoul (KR);
Hee-Sook Park, Seoul (KR)

(73) Assignee: Samsung Electronics Co., LTD (KR)

( * ) Notice: Subject to any disclaimer, the term of this patent is extended or adjusted under 35 U.S.C. 154(b) by 0 days.

(21) Appl. No.: 10/377,805

(22) Filed: Mar. 4, 2003

(65) Prior Publication Data

US 2004/0013818 A1 Jan. 22, 2004

(30) Foreign Application Priority Data

Jul. 19, 2002 (KR) .................................. 2002-0042598

(51) Int. Cl.$^7$ ............................................. C23C 16/56
(52) U.S. Cl. ..................... 427/535; 427/576; 427/250; 427/255.391; 134/1.1; 134/22.1
(58) Field of Search ................................ 427/535, 576, 427/250, 255.391; 134/1.1, 22.1

(56) References Cited

U.S. PATENT DOCUMENTS 6,040,021 A * 3/2000 Miyamoto .................. 427/576

2002/0094387 A1 * 7/2002 Bhan .......................... 427/569

FOREIGN PATENT DOCUMENTS

| KR | 19980087036 | 12/1998 |
|----|-------------|---------|
| KR | 20010007317 | 1/2001 |
| WO | 9928955 | 6/1999 |
| WO | 9954522 | 10/1999 |

* cited by examiner

Primary Examiner—Timothy Meeks
(74) Attorney, Agent, or Firm—Harness, Dickey & Pierce, P.L.C.

(57) ABSTRACT

After a processing chamber is used to deposit a refractory metal film on a substrate, the chamber is plasma-treated with a gas including either nitrogen and/or hydrogen and in-situ cleaned. By plasma-treating the chamber with a gas including nitrogen, the refractory metal film that forms on interior surfaces of the chamber during substrate processing is nitrided. The nitrided refractory metal film can be removed from the chamber during the in-situ cleaning. By plasma-treating the chamber with a gas including hydrogen, reaction by-products generated in the chamber is diluted removed. The chamber may be plasma-treated in a gas ambient including both nitrogen and hydrogen. Also, the plasma treatment may be performed before and after the in-situ cleaning.

20 Claims, 8 Drawing Sheets

METHOD OF CLEANING A CHEMICAL VAPOR DEPOSITION CHAMBER

RELATED APPLICATION

This patent application claims the benefit of priority under 35 U.S.C. §119 of Korean Patent Application No. 2002-42598, filed on Jul. 19, 2002, the contents of which are hereby incorporated by reference in its entirety.

BACKGROUND OF THE INVENTION

1. Field of the Invention

The present invention relates to a chemical vapor deposition (CVD) method and more particularly, to a method of cleaning a processing chamber after a refractory metal film is deposited on a substrate.

2. Description of the Related Art

As semiconductor devices have been developed to become more highly integrated, the design rule of such devices have decreased. Accordingly, parameters such as the channel length of transistors, the distance between active areas, the wiring width, the distance between wirings, and the size of contacts have been scaled-down. Based on the reduced size of the contacts, a certain type of metal silicide layer has been used to form low resistance contacts in semiconductor devices.

A metal silicide layer is an ohmic layer that can provide a low resistance interface between a silicon substrate and a metal layer formed on the silicon substrate. Also, a metal silicide layer may be formed between a metal layer and an underlying semiconductor region to reduce the possibility of materials in the metal layer and semiconductor region from diffusing into each other. A metal silicide layer can also reduce the possibility of such diffusion of materials between two different metal layers in a multilevel metal systems.

The silicide may be comprised of a material such as titanium silicide ($TiSi_2$), or one of the group-VIII silicides such as $PtSi_2$, $PdSi_2$, $CoSi_2$, $NiSi_2$, etc. In a semiconductor device having a design rule of 0.25 μm or less, titanium silicide is widely used for the metal silicide layers.

Conventionally, a heat treatment, e.g., rapid thermal process (RTP), is carried out after a sputtering process deposits a refractory metal film on an exposed silicon region of a substrate. The heat treatment forms a metal silicide layer between the refractory metal film and the silicon region. However, as the size of a contact hole decreases, and the aspect ratio of the contact hole increases, the sputtering process results in poor coverage of the refractory metal film at the stepped portion of the substrate. Thus, forming a sufficient metal silicide layer on the bottom of the contact hole is difficult.

In order to overcome the difficulty of step coverage due to the sputtering method, a method in which a refractory metal film is deposited using a chemical vapor deposition (CVD) or a plasma-enhanced CVD (PECVD) process has been suggested. During such a process, a metal silicide layer is formed while the refractory metal film is simultaneously deposited. Accordingly, even as the aspect ratio of the contact becomes higher, the refractory metal reacts with the silicon in the active region of the substrate to form a silicide without requiring a subsequent annealing process. This results in a simplified process for providing good step coverage.

However, during the PECVD process, the refractory metal film may also be deposited on surfaces inside the chamber in which the substrate is processed. For example, the refractory metal film may be deposited on the surface of various components in the chamber, including the shower head that supplies processing gases into the chamber, the heater that heats the substrate, etc. Accordingly, an in-situ dry cleaning process should be performed on the chamber after depositing the refractory metal film on the substrate in order to remove the refractory metal film remaining on surfaces inside the chamber.

A titanium silicide layer may be simultaneously formed while a titanium (Ti) film is deposited on the substrate according to a PECVD method using $TiCl_4$ gas. In such cases, after the PECVD process is performed, the chamber is in-situ cleaned by a dry cleaning process using $Cl_2$ gas to thereby remove titanium films deposited on the interior surfaces of the chamber. Methods are disclosed in PCT Publication No. WO 1999-028955, Korean Patent Laid-Open Publication No. 2001-0007317, Korean Patent Laid-Open Publication No. 1998-087036, etc., in which the chamber is in-situ dry-cleaned to remove titanium films deposited on the inside of the chamber, after depositing the PECVD-Ti film.

However, such an in-situ cleaning process using $Cl_2$ gas has the following disadvantages. The titanium film on the shower head surface may not be completely removed by the chamber cleaning because the titanium film contains a large quantity of chlorine (Cl) dissociated from $TiCl_4$ gas. Further, chlorine atoms dissociated from $Cl_2$ gas react with titanium atoms during the in-situ cleaning process, thereby generating reaction by-products such as $TiCl_x$ (x=1~4) or Cl type impurities in high quantities. These reaction by-products remain in the chamber after the in-situ chamber cleaning is completed.

If the titanium film is not removed from the interior surfaces and reaction by-products remain after the chamber cleaning, the effectiveness of the PECVD-Ti process suffers when it is subsequently carried out on other wafers (or substrates). As a result, sheet resistance uniformity of the wafers and sheet resistance reproducibility of the titanium film become poor.

PCT Publication No. WO 1999-054522 discloses a method where $NH_3/H_2/Ar$ plasma is formed in the chamber to remove cleaning gases and impurities left in the chamber after the PECVD chamber is in-situ cleaned with gases such as $NH_3$, $ClF_3$, $Cl_2$, etc. However, since this method is used for periodically conditioning the PECVD chamber, the chamber cleaning is not performed after each and every wafer is processed. Thus, as the number of wafers being processed increases, unnecessary titanium films and reaction by-products continuously accumulate on the interior surfaces of the chamber, thereby deteriorating the PECVD-Ti film characteristics.

SUMMARY OF THE INVENTION

In an exemplary embodiment, the present invention provides a method of cleaning a processing chamber used for depositing a refractory metal film on a substrate by both plasma-treating the chamber with a gas including either nitrogen and/or hydrogen and in-situ cleaning the chamber.

In an exemplary embodiment, the chamber is plasma-treated with a gas including at least nitrogen to nitride any refractory metal film remaining in the interior of the chamber. The chamber is in-situ cleaned with a cleaning gas to remove the nitrided metal film from the chamber interior.

In exemplary embodiments, the method of the present invention may be used to clean a chamber that deposits a refractory metal film using a chemical vapor deposition (CVD) process. In an exemplary embodiment, a plasma-enhanced CVD (PECVD) process may be used to deposit a titanium (Ti) film on each substrate, for example, using titanium tetrachloride (TiCl$_4$) gas. The cleaning gas may include a Cl$_2$ gas to remove the nitrided Ti film from the chamber interior after a processed substrate is removed.

In an exemplary embodiment, the nitriding gas may also include hydrogen in order to dilute reaction by-products generated in the chamber when the refractory metal film is deposited on each substrate. According to another exemplary embodiment, after the refractory metal film is nitrided and the chamber is in-situ cleaned, the chamber may be plasma-treated with a third gas including either nitrogen and/or hydrogen. The third gas may include hydrogen for removing any reaction by-products remaining in the chamber as a result of the process of depositing the refractory metal film on the substrate, or removing reaction by-products generated as a result of the in-situ cleaning of the chamber. Also, the third gas may include nitrogen for further nitriding any refractory metal film remaining in the substrate after the in-situ cleaning.

In an exemplary embodiment, both the nitriding gas and the third gas may comprise gases including both nitrogen and hydrogen. For example, N$_2$/H$_2$ gas or NH$_3$ gas may be used for both the nitriding gas and the third gas.

In another exemplary embodiment, the chamber may be used to deposit a refractory metal film on multiple substrates, successively. The steps of plasma-treating the chamber with the nitriding gas, in-situ cleaning the chamber, and plasma-treating the chamber may be repeated after each substrate is processed in the chamber In another exemplary embodiment of the present invention, a chamber used for depositing a refractory metal film on a substrate may be in-situ cleaned with a cleaning gas, and then plasma-treated with a gas including at least hydrogen to remove reaction by-products generated during the processing of wafer and/or the in-situ cleaning. The chamber may be used for depositing the refractory metal film successively on a plurality of substrates, and the in-situ cleaning and plasma-treating steps may be performed after each substrate is processed. In another exemplary embodiment, the cleaning gas may include Cl$_2$ gas, and the chamber may be plasma-treated with a gas including at least hydrogen and nitrogen in order to both remove reaction by-products from the chamber and to nitride any refractory metal film in the chamber.

By nitriding the refractory metal film remaining on interior surfaces of the chamber after processing and removing the wafer stable bonds between the nitrogen atoms and the refractory metal molecules (e.g., Ti atoms) suppress chorine (Cl) atoms dissociating from Cl$_2$ gas from reacting with molecules in the refractory metal film. Thus, the generation of reaction by-product (e.g., TiCl$_x$ or Cl-type compounds) is reduced when the chamber is in-situ cleaned with Cl$_2$ gas. Furthermore, when the chamber is plasma-treated with a gas containing hydrogen, hydrogen ions in the plasma replace, and thereby reduce the amount of, chlorine Cl atoms in the surface of the refractory metal film. Accordingly, sheet resistance uniformity of the refractory metal film deposited on each processed substrate is improved, as well as sheet resistance reproducibility when multiple substrates are processed.

BRIEF DESCRIPTION OF THE DRAWINGS

The above and other advantages of exemplary embodiments of the present invention will become readily apparent by reference to the following detailed description when considered in conjunction with the accompanying drawings wherein.

DETAILED DESCRIPTION OF EXEMPLARY EMBODIMENTS

The present invention and exemplary embodiments thereof are described more fully with reference to the accompanying drawings. The invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. When a layer is referred to as being "on" another layer or substrate, the layer may be directly on the other layer or substrate, or intervening layers may also be present.

Also, it should be noted that the term PECVD-Ti film in the following description is used to refer to any titanium film deposited according to a PECVD process according to exemplary embodiments of the present invention. Although exemplary embodiments of the present invention are described below with respect to depositing a titanium film according to the PECVD process, it should be noted that the present invention is not thus limited. Exemplary embodiments of the present invention cover the deposition of any type of metal film by any process that will be contemplated by one of ordinary skill in the art.

Figure 1:
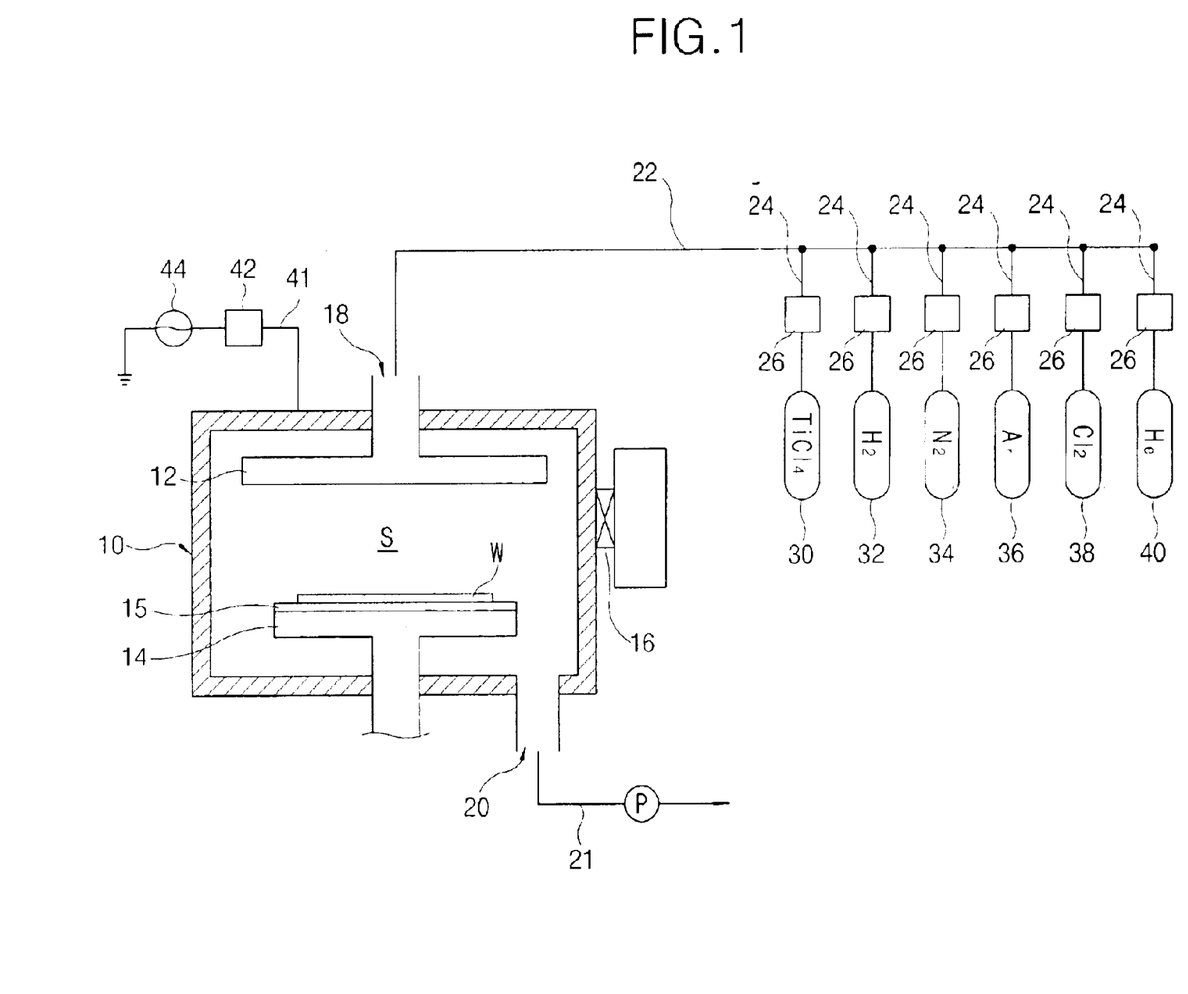
FIG. 1 is a schematic diagram of CVD equipment used to deposit a PECVD-Ti film on a wafer according to an exemplary embodiment of the present invention.

FIG. 1 illustrates a schematic view of the CVD equipment used to deposit a PECVD-Ti film on a semiconductor substrate or wafer according to an exemplary embodiment of the present invention. Referring to FIG. 1, such equipment includes a processing chamber (or reactor) 10 in which the titanium film is deposited on a water W. A gate valve 16, which is arranged on a portion of the sidewall of the chamber 10, is opened and closed in order to allow a wafer W to be transferred into and out of the chamber 10. An outlet 20 at the bottom of the chamber 10 is coupled to an exhaust pipe 21. The exhaust pipe 21 is connected to a vacuum pump P, which is used to vacuumize the interior of the chamber 10.

The wafer W is mounted within the chamber 10 on a susceptor 15. The susceptor 15 comprises a non-conductive material arranged on top of a heater 14, which is used to heat the wafer W to a desirable temperature. An electrode static chuck (not shown) comprising a thin ceramic material is formed on the top surface of the susceptor 15. The wafer W adheres to the susceptor 15 by means of a Coulomb's force generated by the electrode static chuck.

The chamber 10 also includes lift pins (not shown) arranged near the susceptor 15. The lift pins are used for transferring the wafer W into and out of the chamber 10. Specifically, an elevating mechanism (not shown) causes the lift pins to ascend and descend, thereby moving the wafer (W) up and down.

A shower head 12 is attached to the upper wall of the chamber 10, directed toward the susceptor 15. Being spaced apart from the susceptor 15, the face of the shower head 12 covers the entire top surface of the susceptor 15. Plasma is formed in the processing zone S between the shower head 12 and the susceptor 15. The face of the shower head 12 includes a plurality of holes (not shown) through which process gases are sprayed into the chamber 10.

A gas inlet 18 introduces the process gases through the upper wall of the chamber 10 into the shower head 12. A gas supply line 22 capable of supplying multiple types of gases is connected to the gas inlet 18. According to an exemplary embodiment, multiple gas sources 30, 32, 34, 36, 38, and 40 are attached to the gas supply line 22 via branch lines 24. Gas source 30 stores titanium tetrachloride gas ($TiCl_4$) as a processing gas. Gas sources 32 and 34 store hydrogen gas ($H_2$) and nitrogen gas ($N_2$), respectively, as reaction gases. Gas source 36 stores argon gas (Ar) as a plasma ignition gas, and gas source 38 stores chlorine gas ($Cl_2$) as a cleaning gas. In an exemplary embodiment where $TiCl_4$ is stored as a liquid rather than a gas, the gas supply line 22 may be attached to a gas source 40, which stores helium gas (He). The He gas may be used as a carrier gas for supplying liquid $TiCl_4$ to the chamber 10.

Mass flow controllers (MFC) 26 may be attached to the branches 24 to measure the flow of gases from each of the gas sources 30, 32, 34, 36, 38 and 40 through their respective branches 24. In case a liquid $TiCl_4$ source is attached to the supply line 22, a liquid flow meter (LFM) may be implemented to measure the liquid flowing through the respective branch 24 of the liquid $TiCl_4$ source.

In order to form the plasma in the processing zone S between the shower head 12 and the susceptor 15, a matching network 42 and a RF power supply 44 are connected to the upper wall of the chamber 10 via a lead line 41. Preferably, the RF power supply 44 provides a RF power of about 1000 W or less to the shower head 12 at a relatively low frequency of about 400~500 kHz.

Figure 2:
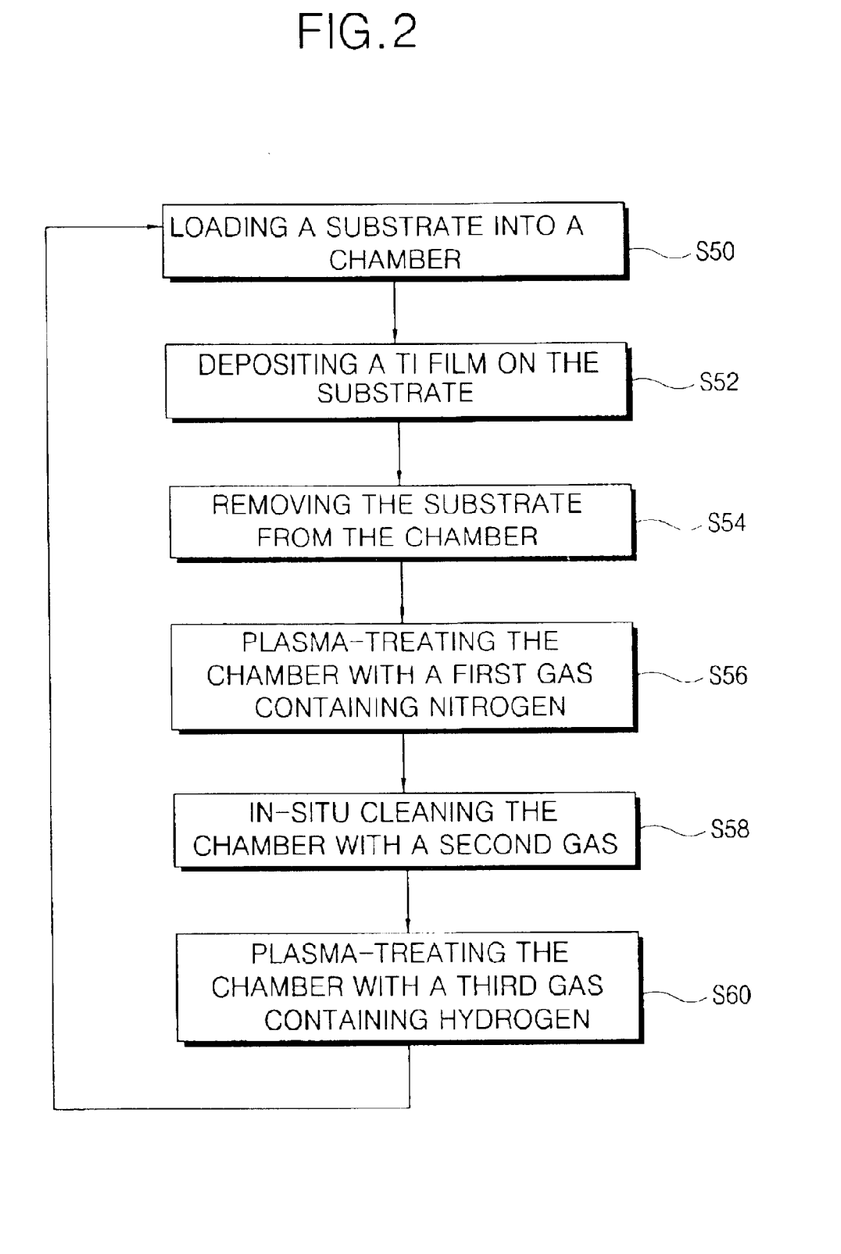
FIG. 2 is a flow chart illustrating the process of depositing a PECVD-Ti film on one or more wafers according to an exemplary embodiment of the present invention.

FIG. 2 is a flow chart illustrating the process of depositing a PECVD-Ti film on one or more wafers according to an exemplary embodiment of the present invention.

Referring to FIGS. 1 and 2, a semiconductor substrate or wafer W is loaded into the processing chamber 10 and mounted on the susceptor 15 in step S50. The Ti film is deposited on the wafer W, as shown in step S52. A detailed description of this step, according to an exemplary embodiment, is provided below. It should be noted that this description is merely illustrates an exemplary process for depositing a titanium film on the wafer and in no way limits the present invention. Exemplary embodiments of the present invention cover all variations and modifications to this process as will be contemplated by those of ordinary skill in the art.

The wafer is heated (e.g., to a temperature of about 550~650° C.) and the chamber 10 is vacuumized (e.g., to a pressure of about 1~10 torr). Approximately 3~10 sccm of $TiCl_4$ gas, 1000~5000 sccm of $H_2$ gas, and 500~5000 sccm of Ar gas are introduced into the chamber 10 from the respective gas sources 30, 32, 36 via the gas supply line 22 and the shower head 12. At the same time, a low frequency power, e.g. RF power of about 1000 W or less, is applied to the shower head 12 from the RF power supply 44 while the susceptor 15 is grounded, thereby generating a plasma in the processing zone S between the shower head 12 and the susceptor 15.

The titanium film is deposited on the wafer W as the $TiCl_4$ as reacts with $H_2$, thereby reducing the $TiCl_4$. At the same time, at the silicon regions of the wafer W on which the titanium film is deposited, titanium atoms react with silicon atoms to form a titanium silicide ($TiSi_x$) layer between the titanium film and the silicon regions (step S52).

The titanium film is heat-treated or plasma-treated in a nitridation ambient. Here, the nitridation ambient may be formed by introducing ammonia gas ($NH_3$) or nitrogen gas ($N_2$) gas into the reaction chamber. Accordingly, the titanium atoms on the surface of the titanium film are nitrided to form a thin layer of titanium nitride. The nitridation is effective to decrease the amount of chlorine (Cl) atoms in the titanium film and the titanium silicide film.

As the PECVD-Ti film is deposited, reaction by-products may be generated, such as hydrochloric acid (HCl), titanium chloride ($TiCl_x$, x=1~4), etc. The generated HCl gas can be exhausted outside the chamber 10 via the outlet 20 in subsequent purge/pumping processes. However, $TiCl_x$ gas has extremely low vapor pressure and cannot be exhausted outside the chamber 10. In addition, the generated $TiCl_x$ may attach to the inner walls of the chamber 10 and the surface of the various internal chamber components, such as the shower head 12, the heater 14, etc.

In addition, while the PECVD-Ti film is being deposited on the surface of the wafer W, the PECVD-Ti film may also form on the inner walls of the chamber 10 as well as the surface of the various inner chamber components (e.g., the shower head 12, the heater 14, etc.).

Accordingly, before the next wafer W is processed, the interior of the chamber 10 is cleaned to remove the reaction by-products and the extraneous titanium film, which are generated inside the chamber 10 while the PECVD-Ti film is deposited on the wafer W. An exemplary embodiment of this cleaning process, as illustrated by steps S54~S60, will be described in detail below. However, exemplary embodiments of the present invention cover various changes and modifications in the process described below, as will be contemplated by those ordinarily skilled in the art.

Specifically, after the chamber pressure is pumped in order to vacuumize the chamber 10, the gate valve 16 is opened to remove the wafer W with the PECVD-Ti film deposited thereon from the chamber 10, as shown in step S54.

The chamber is plasma-treated according to step S56. Specifically, after the gate valve 16 is closed, a first gas including nitrogen atoms (N), e.g., approximately 300~1000 sccm of $N_2$ gas, is introduced into the chamber 10 via the shower head 12. While the first gas is introduced, the RF power supply 44 applies a low frequency power, e.g., approximately 1000 W or less, to the shower head 12, thereby forming a plasma from the $N_2/H_2$ gas in the processing zone S between the shower head 12 and the susceptor 15.

Nitrogen ions in the plasma nitride the titanium film, which has formed inside the chamber 10, into TiN. Also, since portions of this titanium film may contain chlorine atoms dissociated from the processing gas used for depositing the titanium film, i.e., the $TiCl_4$ gas. While the titanium film is nitrided inside the chamber 10, the hydrogen ions in the plasma collide against the surface of the titanium film in order to replace chlorine atoms in the surface of the titanium film with an HCl-type compound, thereby reducing the amount of chlorine in the titanium film. Thus, the nitrided titanium film is less resistant to in-situ cleaning.

In an exemplary embodiment, the first gas may also include hydrogen atoms (H), e.g., approximately 1000~5000 sccm of $H_2$ gas in addition to the nitrogen gas. In an exemplary embodiment, the first gas may comprise $N_2/H_2$ gas or $NH_3$ gas. The hydrogen ions in the plasma can dilute reaction by-products, such as $TiCl_x$, which is attached to the interior surfaces of the chamber 10.

After the titanium film is nitrided, the chamber 10 is in-situ cleaned using a second cleaning gas, according to step S58. The in-situ cleaning can be performed using, for example, approximately 100~500 sccm of $Cl_2$ gas. Accordingly, nitrided titanium film is etched and removed from the interior of the chamber 10. Since the titanium film inside has been nitrided by plasma-treatment, the stable Ti-N bonds are maintained in the titanium film to suppress the reaction of the chlorine atoms dissociated from the cleaning gas ($Cl_2$) with titanium atoms in the titanium film. Accordingly, the generation of the reaction by-products, such as $TiCl_x$ or other Cl-type by-products, is suppressed during the cleaning process.

In step S60, the chamber 10 is plasma-treated with a third gas containing hydrogen atoms (H). For example, the third gas may include approximately 1000~5000 sccm of $H_2$ gas. As the third gas is introduced into the chamber 10, the RF power supply 44 may apply a low frequency power, e.g., about 1000 W or less, to the shower head 12 thereby forming a plasma from the third gas in the processing zone S between the shower head 12 and the susceptor 15. Thus, the reaction by-products remaining in the chamber 10 are diluted and removed by the plasma.

According to an exemplary embodiment, the third gas may also contain nitrogen atoms (N), e.g., approximately 300~1000 sccm. Accordingly, any titanium film that remains in the chamber 10 may be nitrided by the third gas in this step. In an exemplary embodiment, the third gas may include, e.g., $N_2/H_2$ gas or $NH_3$ gas. In another exemplary embodiment, the third gas may be the same as the first gas introduced into the chamber 10 during step S56.

As shown in FIG. 2, after the chamber 10 is cleaned according to steps S56, S58 and S60, the PECVD process can be performed on a new wafer W. Thus, according to exemplary embodiments of the present invention, the gate valve 16 is opened and the next wafer W is loaded into the chamber 10 according to step S50, and steps S52 to S60 are repeated. Thus, according to an exemplary embodiment of the present invention where a refractory metal film (e.g., PECVD-Ti film) is deposited successively on multiple wafers W, the chamber cleaning steps (i.e., steps S56–S60) may be repeated after each wafer W is processed and removed from the chamber 10.

Advantages provided by exemplary embodiments of the present invention will be made more apparent by the following description referring to FIGS. 3–5.

Figure 3A:
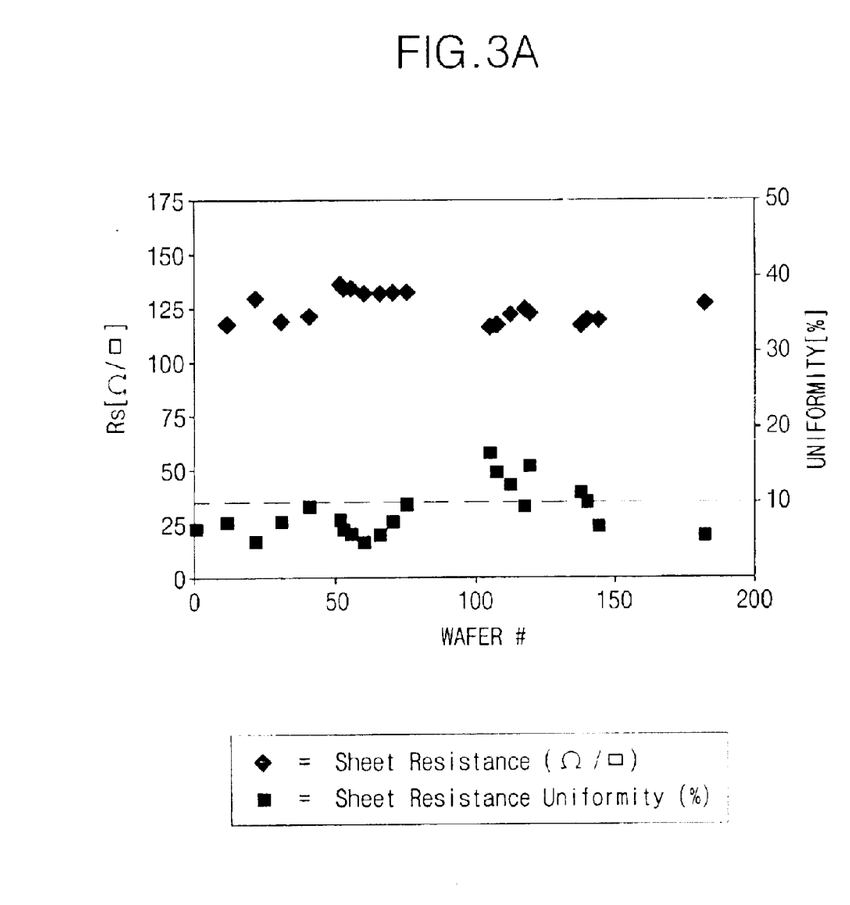
FIG. 3A is a graph showing measured values of average sheet resistance and sheet resistance uniformity of PECVD-Ti films successively deposited on wafers by the conventional PECVD process.

FIG. 3A is a graph showing measured values of average sheet resistance and sheet resistance uniformity of PECVD-Ti films successively deposited on wafers W by the conventional PECVD process. In contrast, the graph in FIG. 3B shows measured values of average sheet resistance and sheet resistance uniformity of PECVD-Ti films successively deposited on wafers W according to an exemplary embodiment of the present invention. In these graphs, the horizontal axis represents the sequence numbers of the wafers W being processed, the left axis represents the sheet resistance in ohms per square ($\Omega$/sq) of the PECVD-Ti film deposited on a particular wafer, and the right axis represents the sheet resistance uniformity of the PECVD-Ti film deposited on a particular wafer.

Figure 4A:
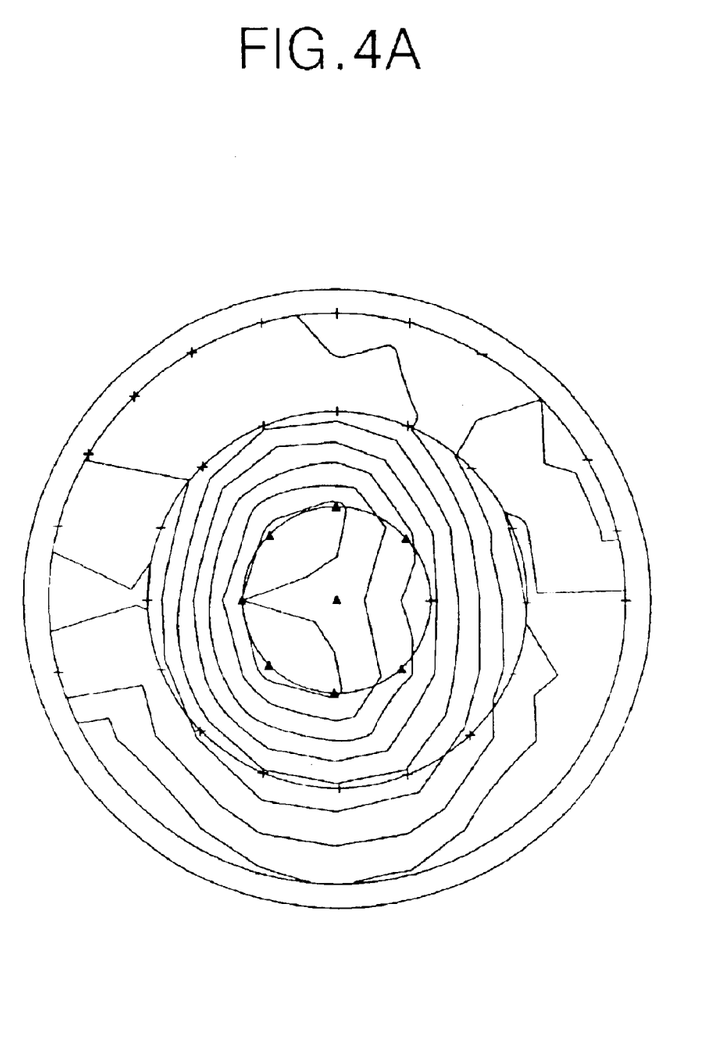
FIG. 4A is a wafer map showing the measured sheet resistance distribution of PECVD-Ti films deposited on wafers by the conventional PECVD process.

FIG. 4A is a wafer map showing the measured sheet resistance distribution of PECVD-Ti films deposited on wafers W by the conventional PECVD process. In contrast, the wafer map in FIG. 4B shows the measured sheet resistance distribution of PECVD-Ti films deposited according to an exemplary embodiment of the present invention.

Referring to FIG. 3A, as the PECVD-Ti films are deposited by the conventional method, the extraneous titanium film that forms inside the PECVD chamber 10 cannot be completely removed. Thus, the PECVD process is performed on subsequent wafers while reaction by-products, such as $TiCl_x$, remain in the chamber. As the more wafers W are successively processed, the titanium film and reaction by-products within the chamber 10 continues to accumulate, thereby degrading sheet resistance uniformity. Thus, the average sheet resistance uniformity obtained for each wafer according to the conventional method is about 9.7%.

Figure 3B:
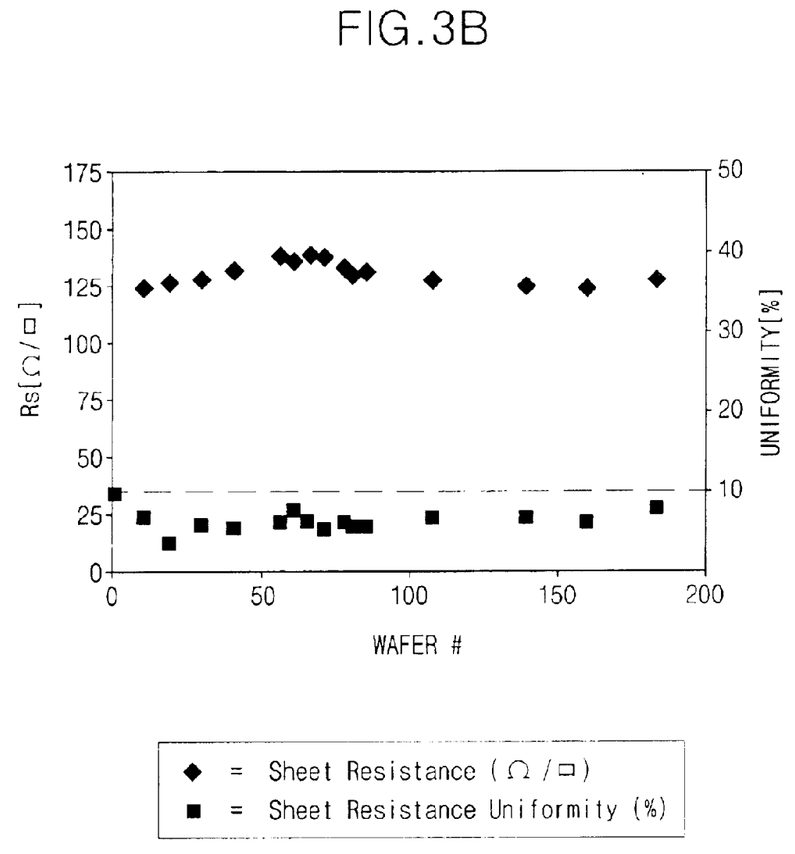
FIG. 3B is a graph showing measured values of average sheet resistance and sheet resistance uniformity of PECVD-Ti films successively deposited on wafers by a PECVD process according to an exemplary embodiment of the present invention.
Figure 4B:
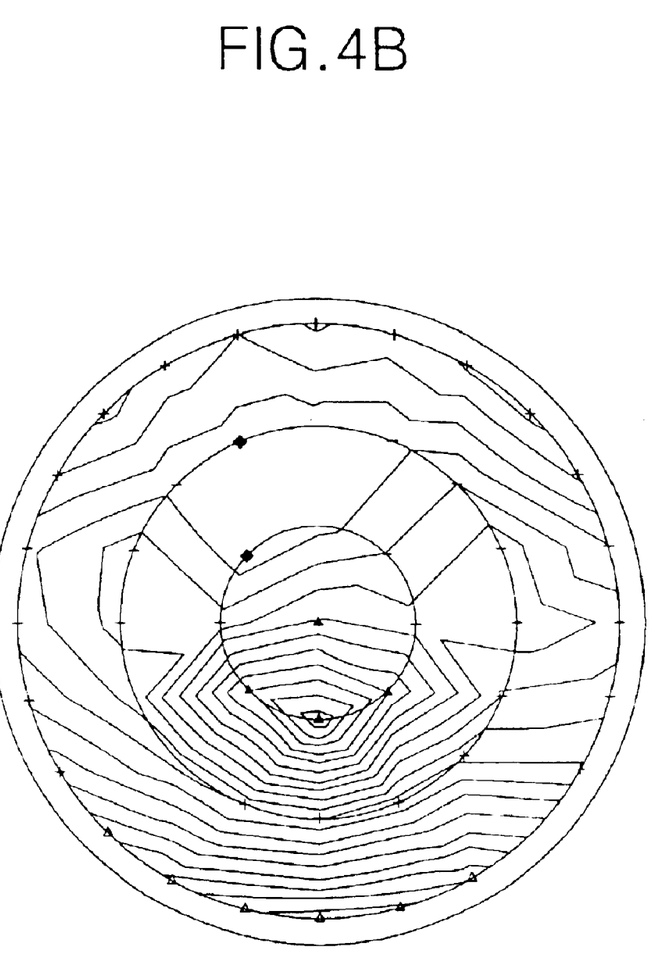
FIG. 4B is a wafer map showing the measured sheet resistance distribution of PECVD-Ti films deposited on wafers by a PECVD process according to an exemplary embodiment of the present invention.

FIG. 3B shows the sheet resistance and sheet resistance uniformity values obtained when chamber cleaning was performed after each and every wafer W was processed and removed from the chamber 10, according to an exemplary embodiment of the present invention. This cleaning process included the steps nitriding the titanium film that had formed within the chamber, removing the nitrided titanium film by in-situ cleaning the chamber, and removing the reaction by-products in the chamber 10, as described above. As shown in FIG. 3B, the sheet resistance of the deposited PECVD-Ti films remained more consistent as wafers W were successively processed according to the exemplary embodiment in comparison to the conventional method of FIG. 3A. Accordingly, FIG. 3B shows an improvement in the reproducibility of the sheet resistance according to the exemplary embodiment. Also, FIG. 3B shows that the exemplary embodiment improves the average sheet resistance uniformity of the deposited PECVD-Ti films to about 5.4%.

Figure 5A:
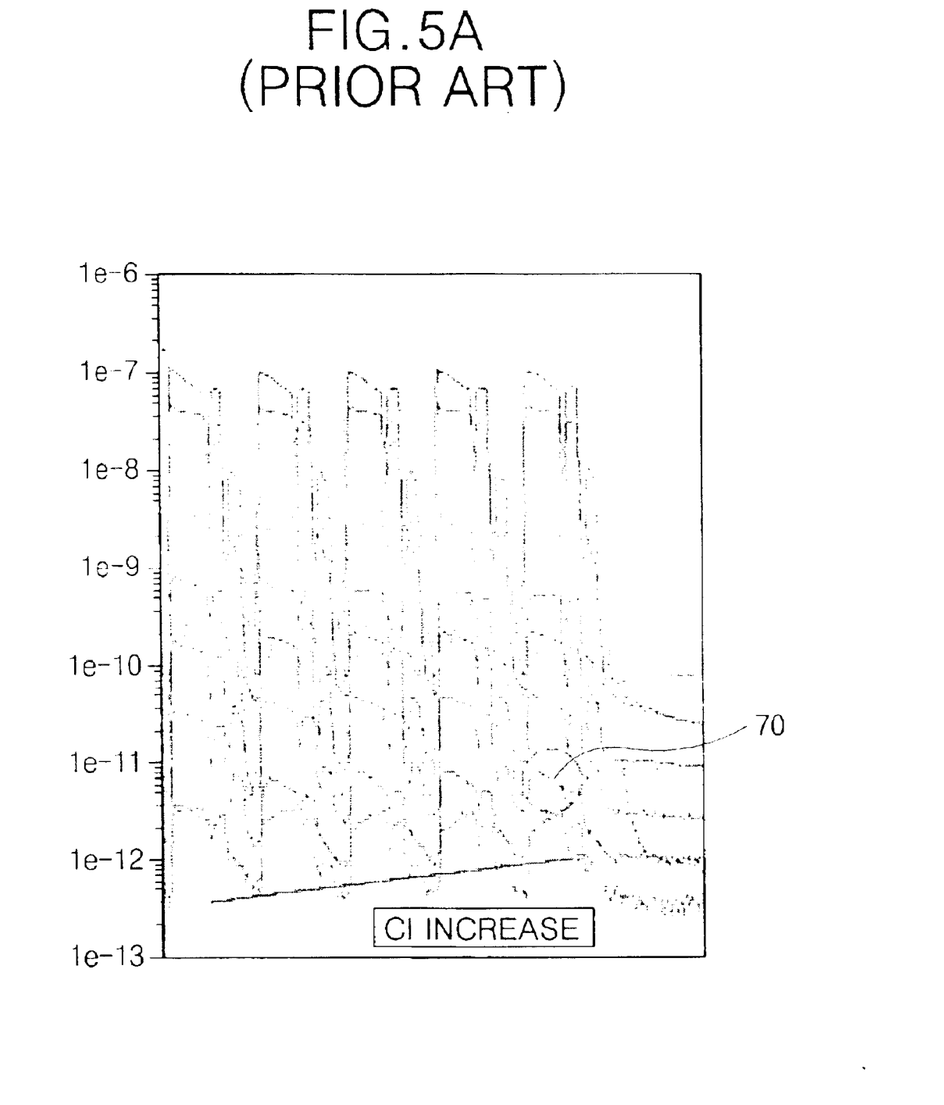
FIG. 5A is a graph showing measured concentrations of chlorine (Cl) exhausted from the chamber while PECVD-Ti films are successively deposited on wafers by the conventional PECVD process.

FIG. 5A is a graph showing measured concentrations of chlorine (Cl) exhausted from the chamber 10 while PECVD-Ti films are successively deposited on wafers by the conventional PECVD process. In contrast, FIG. 5B shows measured concentrations of chlorine (Cl) exhausted from the chamber 10 while PECVD-Ti films are successively deposited on wafers by a PECVD process according to an exemplary embodiment of the present invention.

Line 70 in the graph of FIG. 5A represents the concentration of Chlorine in the gas being exhausted from the chamber 10 when each wafer W is removed during conventional PECVD processing. While each subsequent wafer W is processed, an extraneous titanium film containing a high quantity of chlorine (Cl) atoms accumulates within the chamber 10. In addition, reaction by-products such as titanium chloride ($TiCl_x$) are increasingly generated inside PECVD chamber 10 as more wafers W are processed. Therefore, the concentration of chlorine being exhausted from the chamber 10 gradually increases as more wafers W are processed, as shown by the increasing peaks of line 70.

Figure 5B:
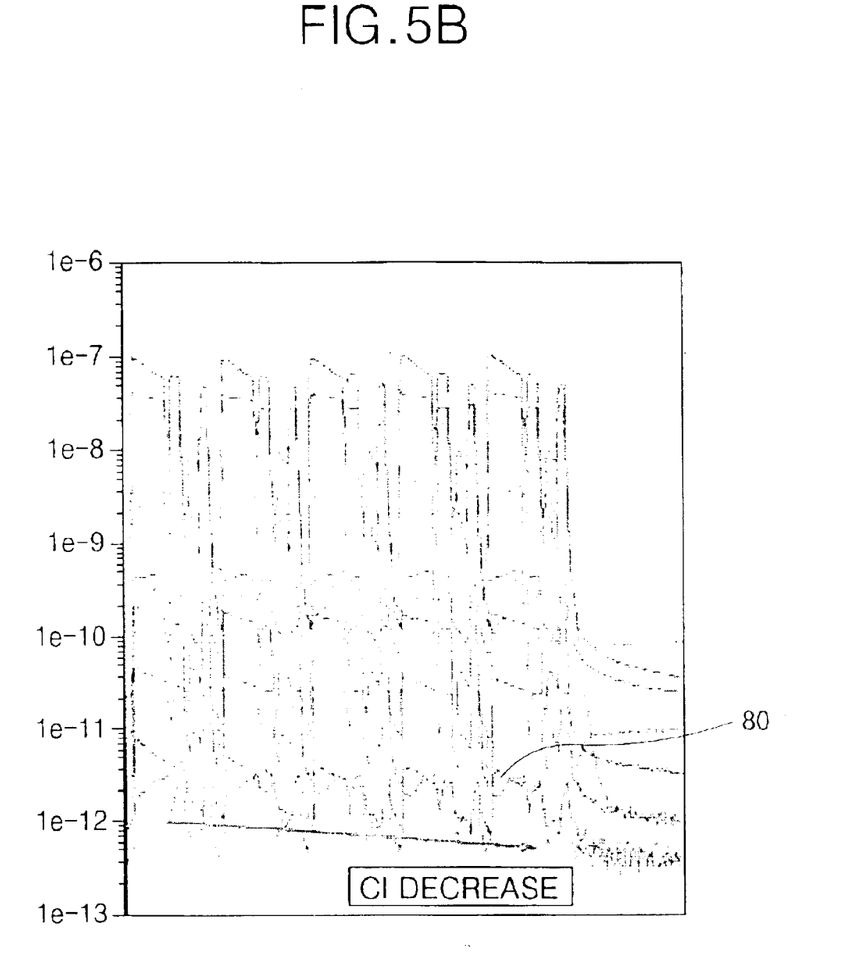
FIG. 5B is a graph showing measured concentrations of chlorine (Cl) exhausted from the chamber while PECVD-Ti films are successively deposited on wafers by a PECVD process according to an exemplary embodiment of the present invention.

Line 80 of FIG. 5B represents the chlorine concentration in the gas being exhausted when each wafer W is removed from the chamber 10 during PECVD processing according to an exemplary embodiment of the present invention. During this processing, after each and every wafer W is removed, the chamber 10 is plasma-treated in a gas ambient including nitrogen (N) and hydrogen (H). The plasma treatment replaces chlorine, which has bonded to the surface of the extraneous titanium film formed within chamber 10, with an HCl-type compound. The plasma treatment also dilutes reaction by-products within the chamber 10, e.g., $TiCl_x$, to facilitate the removal of the reaction by-products. Accordingly, the chlorine concentration of the gas being exhausted from the chamber 10 gradually decreases as processing continues on subsequent wafers W, as shown by the decreasing peaks of line 80.

According to exemplary embodiments of the present invention, after a refractory metal film is deposited on each of a plurality of successive wafers W according to a CVD or PECVD method, the processing chamber 10 is plasma-treated in a gas ambient including at least nitrogen before in-situ cleaning, and plasma-treated in a gas ambient including at least hydrogen after in-situ cleaning. Thus, the extraneous refractory metal film on interior surfaces of the chamber 10 is nitrided to reduce the amount of Cl contained therein, and the formation of reaction by-products such as $TiCl_x$ or Cl-type compounds is suppressed. Exemplary embodiments of the present invention can therefore improve both the sheet resistance uniformity of the refractory metal film deposited on each wafer W, while providing better sheet resistance reproducibility.

It should be noted that exemplary embodiments of the present invention are not limited to the above-described CVD or PECVD processes, and that exemplary embodiments of the present invention cover any suitable method for depositing a refractory metal film on a semiconductor substrate or wafer W, as will be contemplated by those ordinarily skilled in the art.

While this invention has been particularly shown and described with reference to the exemplary embodiments described above, it will be understood by those skilled in the art that these exemplary embodiments do not limit the present invention, and that various changes in form and details may be made without departing from the spirit and scope of the present invention as hereinafter claimed.

What is claimed is:

1. A method of cleaning a chamber used to deposit a refractory metal film on one or more substrates, the method comprising:

plasma-treating and in-situ cleaning the chamber after each of the substrates is processed and removed from the chamber, the chamber being first plasma-treated with a first gas including at least one of nitrogen (N) and hydrogen (H), the chamber then being in-situ cleaned with a second gas.

2. The method as claimed in claim 1, the method including, (a) nitriding the refractory metal film formed on one or more interior surfaces of the chamber with the first gas, the first gas including N; and (b) in-situ cleaning the chamber to remove the nitrided refractory metal film.

3. The method as claimed in claim 2, wherein the refractory metal film includes titanium (Ti).

4. The method as in claim 3, wherein the refractory metal film is deposited on the substrate by plasma-enhanced chemical vapor deposition (PECVD) method using titanium tetrachloride ($TiCl_4$) gas.

5. The method as claimed in claim 2, wherein the step (b) includes in-situ cleaning the chamber with a cleaning gas including $Cl_2$ gas.

6. The method as claimed in claim 2, wherein the first gas further dilutes reaction by-products generated in the chamber while the refractory metal film is deposited on the substrate, the first gas including H.

7. The method as claimed in claim 6, wherein the first gas includes at least one of $N_2/H_2$ gas and $NH_3$ gas.

8. The method as claimed in claim 6, the second gas including $Cl_2$ gas, further comprising:

(c) plasma-treating the chamber using a third gas, the third gas including at least one of N and H.

9. The method as claimed in claim 8, wherein the third gas removes at least one of reaction by-products diluted during the step (a) and reaction by-products generated in the chamber during the step (b), the third gas including H.

10. The method as claimed in claim 9, wherein the third gas further nitrides any refractory metal film remaining on the interior surfaces of the chamber, the third gas including N.

11. The method as claimed in claim 10, wherein the third gas includes at least on of $N_2/H_2$ gas and $NH_3$ gas.

12. The method as claimed in claim 10, the chamber being used to process a plurality of substrates by forming the refractory metal film on each substrate, wherein the steps (a)–(c) are performed after each substrate is processed and removed from the chamber.

13. The method as claimed in claim 1, the chamber being used to process a plurality of substrates by depositing a refractory metal film on each substrate, the method including, (a) in-situ cleaning the chamber with the second gas; and (b) removing reaction by-products generated in the chamber using the first gas, the reaction by-products being generated during the depositing of the refractory metal film and the in-situ cleaning of step (a), the first gas including H, wherein the steps (a) and (b) are repeated after each substrate is processed and removed from the chamber.

14. The method as claimed in claim 13, wherein the step (b) further includes nitriding any refractory metal film remaining on one or more interior surfaces of the chamber, the first gas including N.

15. The method as claimed in claim 14, wherein the step (a) includes, (a1) nitriding refractory metal film formed on one or more interior surfaces of the chamber with a third gas, the third gas including N; and (a2) in-situ cleaning the chamber to remove the nitrided refractory metal film. the second gas including $Cl_2$ gas.

16. The method as claimed in claim 15, wherein the third gas further dilutes reaction by-products formed in the chamber while the refractory metal film is deposited on the substrates, the third gas including H.

17. The method as claimed in claim 16, wherein the refractory metal includes titanium (Ti).

18. The method as claimed in claim 16, wherein the refractory metal film is deposited on each substrate according to a plasma-enhanced chemical vapor deposition (PECVD) method, the PECVD method including the following steps, (P1) loading a substrate in the chamber;

(P2) depositing the refractory metal film on the substrate;

(P3) treating the refractory metal film in a nitridation ambient to form a refractory metal nitride layer on a surface portion of the refractory metal film; and (P4) removing the substrate from the chamber.

19. The method as claimed in claim 18, wherein the step (P3) treats the refractory metal film in a nitridation ambient including at least one of an $NH_3$ atmosphere, an $N_2$ atmosphere, and a mixed atmosphere of $NH_3$ and $N_2$.

20. The method as claimed in claim 18, wherein the step (P3) treats the refractory metal film according to at least one of a heat treatment and a plasma treatment.

* * * * *